(12) United States Patent
Huai et al.

(10) Patent No.: US 10,973,121 B2
(45) Date of Patent: Apr. 6, 2021

(54) BACKLIGHT GOLDEN FINGER STRUCTURE AND DISPLAY DEVICE

(71) Applicants: BOE TECHNOLOGY GROUP CO., LTD., Beijing (CN); BOE (Hebei) Mobile Display Technology Co., Ltd., Hebei (CN)

(72) Inventors: Junqi Huai, Beijing (CN); Ermao Zhang, Beijing (CN); Songsong Shi, Beijing (CN); Pengxin Liu, Beijing (CN); Jun Sheng, Beijing (CN)

(73) Assignees: BOE TECHNOLOGY GROUP CO., LTD., Beijing (CN); BOE (HEBEI) MOBILE DISPLAY TECHNOLOGY CO., LTD., Hebei (CN)

( * ) Notice: Subject to any disclaimer, the term of this patent is extended or adjusted under 35 U.S.C. 154(b) by 553 days.

(21) Appl. No.: 15/761,768

(22) PCT Filed: Aug. 21, 2017

(86) PCT No.: PCT/CN2017/098334
§ 371 (c)(1),
(2) Date: Mar. 20, 2018

(87) PCT Pub. No.: WO2018/045868
PCT Pub. Date: Mar. 15, 2018

(65) Prior Publication Data
US 2020/0236785 A1   Jul. 23, 2020

(30) Foreign Application Priority Data

Sep. 6, 2016   (CN) .................. 201610807038.9

(51) Int. Cl.
*H05K 1/02*   (2006.01)
*H05K 1/11*   (2006.01)
*H05K 1/09*   (2006.01)

(52) U.S. Cl.
CPC .......... *H05K 1/115* (2013.01); *H05K 1/0277* (2013.01); *H05K 1/09* (2013.01); *H05K 1/118* (2013.01);
(Continued)

(58) Field of Classification Search
CPC ........ H05K 1/147; H05K 1/148; H05K 1/115; H05K 1/0277; H05K 1/118; H05K 2201/058; H05K 2201/09263
See application file for complete search history.

(56) References Cited

U.S. PATENT DOCUMENTS 5,917,149 A  *  6/1999  Barcley ............... H05K 1/0281
                                                            174/36
8,071,884 B2    12/2011  Wang et al.
(Continued)

FOREIGN PATENT DOCUMENTS

CN          200953683 Y        9/2007
CN          201066955 Y        5/2008
(Continued)

OTHER PUBLICATIONS

First Chinese Office Action, for Chinese Patent Application No. 201610807038.9, dated May 3, 2018, 13 pages.
(Continued)

*Primary Examiner* — Hoa C Nguyen
(74) *Attorney, Agent, or Firm* — Kinney & Lange, P.A.

(57) ABSTRACT

The embodiments of the present disclosure relate to the technical field of manufacturing display device, and disclose a backlight golden finger structure and a display device. The backlight golden finger structure includes: a plurality of golden finger bodies, one end of each golden finger body being configured to be connected with a backlight flexible circuit board, the other end of each golden finger body being overhung and configured to be connected with a display
(Continued)

panel flexible circuit board at a first surface of the backlight golden finger structure; and a first covering film disposed on the first surface of each golden finger body, an edge of the first covering film adjacent to the overhung end of the golden finger body being in a curved shape.

8 Claims, 2 Drawing Sheets

(52) U.S. Cl.
CPC ............... *H05K 2201/058* (2013.01); *H05K 2201/09263* (2013.01)

(56) References Cited

U.S. PATENT DOCUMENTS

| | | |
|---|---|---|
| 2006/0027395 A1 | 2/2006 | Cho |
| 2014/0144678 A1* | 5/2014 | Lin .................. H01R 12/592 174/254 |
| 2017/0192565 A1* | 7/2017 | Pan .................. G06F 3/04164 |

FOREIGN PATENT DOCUMENTS

| | | |
|---|---|---|
| CN | 101346035 A | 1/2009 |
| CN | 102006719 A | 4/2011 |
| CN | 102427680 A | 4/2012 |
| CN | 202303239 U | 7/2012 |
| CN | 203934147 U | 11/2014 |
| CN | 204031587 U | 12/2014 |
| CN | 104955270 A | 9/2015 |
| CN | 104981110 A | 10/2015 |
| CN | 205232566 U | 5/2016 |
| CN | 106211569 A | 12/2016 |
| CN | 206196135 U | 5/2017 |

OTHER PUBLICATIONS

English Translation of International Search Report & Box V of Written Opinion, for PCT Patent Application No. PCT/CN2017/098334, dated Nov. 20, 2017, 14 pages.

Second Chinese Office Action dated Jan. 2, 2019, received for corresponding Chinese Application No. 201610807038.9.

* cited by examiner

US 10,973,121 B2

BACKLIGHT GOLDEN FINGER STRUCTURE AND DISPLAY DEVICE

CROSS-REFERENCE TO RELATED APPLICATION

This application is the national phase of PCT Application No. PCT/CN2017/098334 filed on Aug. 21, 2017, which in turn claims the priority benefit of Chinese Patent Application No. 201610807038.9 filed on Sep. 6, 2016 in the State Intellectual Property Office of China, the whole disclosure of which is incorporated herein by reference.

FIELD OF THE DISCLOSURE

The embodiments of the present disclosure relate to the technical field of manufacturing display device, and especially relate to a backlight golden finger structure and a display device.

DESCRIPTION OF THE RELATED ART

Currently, a LED backlight module has been used in a liquid crystal module having a small or medium size. With thinning of the liquid crystal module and requirements of simplifying interfaces, for electrically connecting a backlight source, a solution is usually used in which a lead of a LED flexible circuit board is soldered to a golden (electrically connecting) finger, and then the golden finger is then folded up and soldered to a display panel flexible circuit board of a display panel. Because the existing golden fingers need to be folded up, a soldered part between the golden finger and the flexible circuit board of the display panel will be easily broken when the golden finger is subjected to an external force, thereby adversely affecting display performance of a display device.

SUMMARY

Embodiments of the present disclosure provide a backlight golden finger structure and a display device.

According an aspect of the present disclosure, there is provided a backlight golden finger structure, comprising:

a plurality of golden finger bodies, one end of each of the plurality of golden finger bodies being configured to be connected with a backlight flexible circuit board, the other end of each of the plurality of golden finger bodies being overhung and configured to be connected with a display panel flexible circuit board at a first surface of each of the plurality of golden finger bodies; and a first covering film disposed on the first surface of each of the plurality of golden finger bodies, an edge of the first covering film adjacent to the overhung end of the golden finger body being in a curved shape.

In some optional embodiments, a second covering film is provided on a second surface of each golden finger body facing away from the first surface, and an edge of the second covering film adjacent to the overhung end of the golden finger body is in a curved shape.

In some optional embodiments, a pattern of an orthographic projection of the edge of the first covering film adjacent to the overhung end of the golden finger body onto the display panel flexible circuit board is not overlapped with a pattern of an orthographic projection of the edge of the second covering film adjacent to the overhung end of the golden finger body onto the display panel flexible circuit board.

In some optional embodiments, the edge of the first covering film adjacent to the overhung end of the golden finger body is closer to the overhung end of the golden finger body than the edge of the second covering film adjacent to the overhung end of the golden finger body.

In some optional embodiments, a shape of the edge of the first covering film adjacent to the overhung end of the golden finger body is the same as a shape of the edge of the second covering film adjacent to the overhung end of the golden finger body.

In some optional embodiments, the curved shape is a wavy line.

In some optional embodiments, the golden finger body further comprises a through hole penetrating through the first covering film, the golden finger body and the second covering film.

In some optional embodiments, a position of the through hole provided in one of any two adjacent golden finger bodies is different from a position of the through hole provided in the other of the any two adjacent golden finger bodies.

According another aspect of the present disclosure, there is provided a display device, comprising a backlight flexible circuit board and a display panel flexible circuit board, characterized in that, the display device further comprises above backlight golden finger structure.

BRIEF DESCRIPTION OF THE DRAWINGS

The drawings described herein are used to provide a further understanding of the present disclosure and constitute a part of the disclosure. The exemplary embodiments of the disclosure and the descriptions thereof are used to explain the disclosure, and do not constitute improper limitations to the disclosure. In the drawings.

DETAILED DESCRIPTION OF PREFERRED EMBODIMENTS

Figures 1, 2:
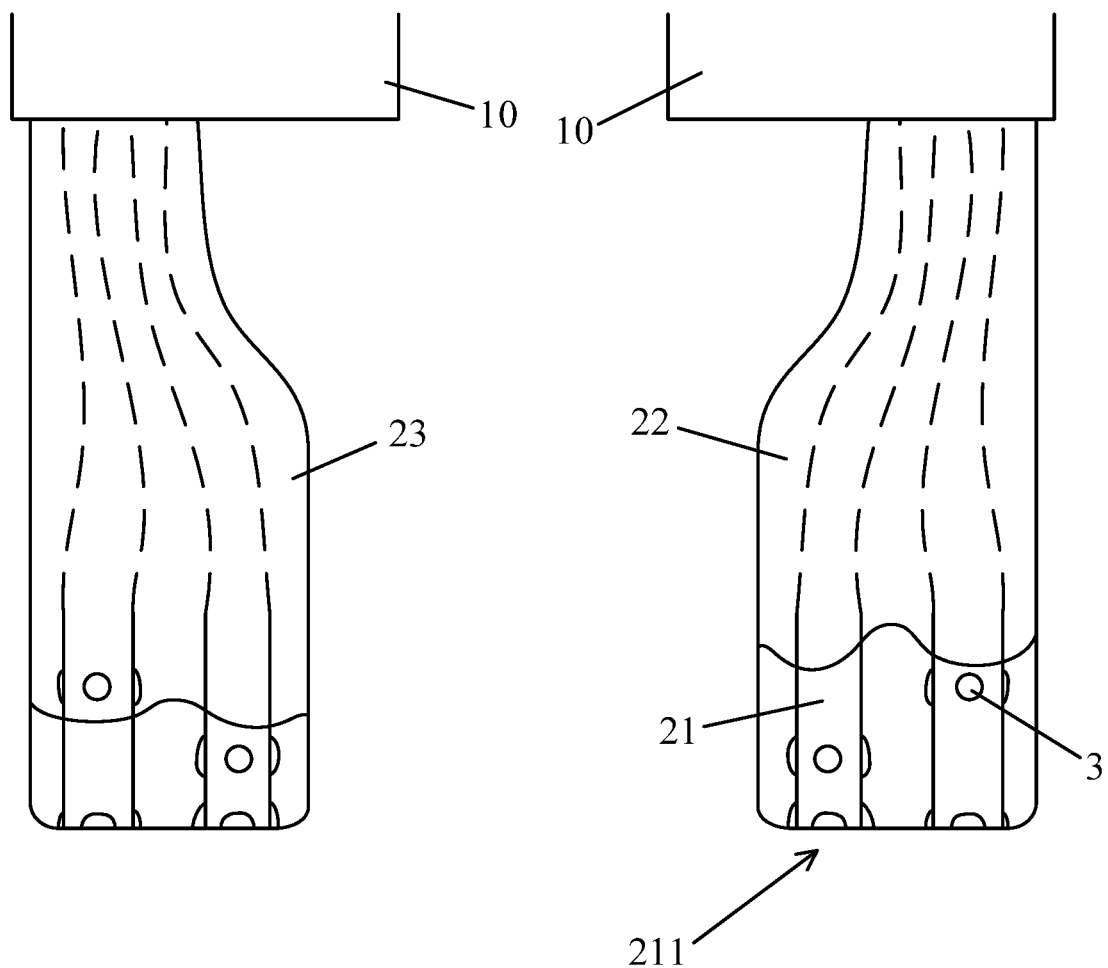
FIG. 1 is a schematic diagram of a first surface of a backlight golden finger structure according to an embodiment of the present disclosure.
FIG. 2 is a schematic diagram of a second surface of a backlight golden finger structure according to an embodiment of the present disclosure.

The technical solutions of embodiments of the present disclosure will be clearly and completely described below with reference to the accompanying drawings in the embodiments of the present disclosure. Apparently, the described embodiments are merely a part but not all of the embodiments of the present disclosure.

The technical solutions of the present disclosure will be further described below with reference to the embodiments and the accompanying drawings. In the description, the same or similar reference numerals denote the same or similar components. The following description of the embodiments of the present invention with reference to the accompanying drawings is intended to explain the general inventive concept of the present disclosure, and should not be construed as a limitation on the present disclosure.

In addition, in the following detailed description, numerous specific details are set forth in order to provide a thorough understanding of embodiments of the disclosure for the convenience of explanation. Clearly, however, one or more embodiments may be practiced without these specific details. In other instances, well-known structures and devices are schematically described to simplify the drawings.

According to a general concept of the present disclosure, there is provided a backlight golden finger structure, characterized in comprising:

a plurality of golden finger bodies, one end of each golden finger body being configured to be connected with a backlight flexible circuit board, the other end of each golden finger body being overhung and configured to be connected with a display panel flexible circuit board at a first surface of the backlight golden finger structure; and a first covering film disposed on the first surface of each golden finger body, an edge of the first covering film adjacent to the overhung end of the golden finger body being in a curved shape.

In the backlight golden finger structure provided by the present disclosure, the edge, which is adjacent to the overhung end of the golden finger body, of the first covering film on a first surface of the backlight golden finger body for being connected with the flexible circuit board of the display panel is in a curved shape, such that the part of the first covering film soldered to the flexible circuit board of the display panel is connected in a curved contact way, which may reduce occurrence of stress concentration.

Thus, the backlight golden finger structure provided by the present disclosure has a better connection strength and may reduce the occurrence of self-breakage phenomenon.

Figure 3:
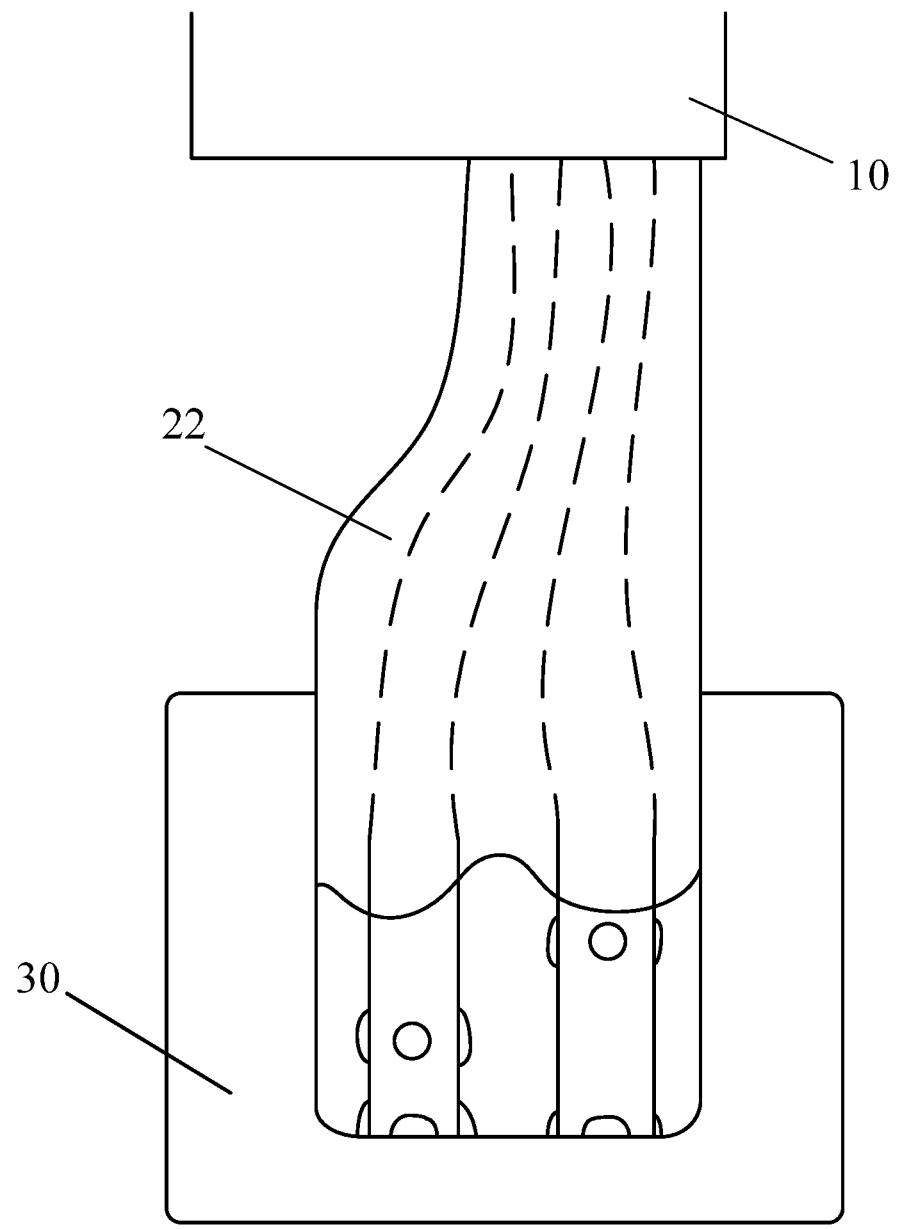
FIG. 3 is a schematic diagram of a backlight golden finger structure respectively connected to a backlight flexible circuit board and a display panel flexible circuit board according to an embodiment of the present disclosure.

Referring to FIGS. 1-3, in which FIG. 1 is a schematic diagram of a first surface of a backlight golden finger structure according to an embodiment of the present disclosure; FIG. 2 is a schematic diagram of a second surface of a backlight golden finger structure according to an embodiment of the present disclosure; and FIG. 3 is a schematic diagram of a backlight golden finger structure respectively connected to a backlight flexible circuit board and a display panel flexible circuit board according to an embodiment of the present disclosure. The present disclosure provides a backlight golden finger structure, comprising:

a plurality of golden finger bodies 21, one end of each golden finger body 21 being connected with a backlight flexible circuit board 10, the other end of each golden finger body being disposed in an overhung way and configured to be connected with a display panel flexible circuit board 30 at a first surface of the backlight golden finger structure; and a first covering film 23 disposed on the first surface of each golden finger body 21, an edge of the first covering film adjacent to the overhung end 211 of the golden finger body 21 being in a curved shape.

In the backlight golden finger structure provided by the present disclosure, the edge, which is adjacent to the overhung end 211 of the golden finger body 21, of the first covering film 23 on a first surface of the golden finger body 21 for being connected with the flexible circuit board 30 of the display panel is in a curved shape, such that the part of the first covering film 23 soldered to the flexible circuit board 30 of the display panel is connected in a curved contact way, which may reduce occurrence of stress concentration.

Thus, the backlight golden finger structure provided by the present disclosure has a better connection strength and may reduce the occurrence of self-breakage phenomenon.

Further, as shown in FIG. 2, a second covering film 22 is disposed on a second surface of each golden finger body 21, and an edge of the second covering film 22 adjacent to the overhung end 211 of the golden finger body 21 is in a curved shape. The edge of the second covering film 22 adjacent to the overhung end 211 of the golden finger body 21 is not soldered to the display panel flexible circuit board 30. The second covering film 22 is disposed on a surface of the golden finger body 21 facing away from the display panel flexible circuit board 30, that is, on the second surface of the golden finger body. The edge of the second covering film 22 adjacent to the overhung end 211 of the golden finger body 21 is in a curved shape, thereby reducing stress concentration in the second covering film 22, and thus improving the overall strength of the backlight golden finger structure.

As shown in FIGS. 1 and 2, in order to further reduce the occurrence of stress concentration, a pattern of an orthographic projection of the edge of the first cover film 23 adjacent to the overhung end 211 of the golden finger body 21 onto the display panel flexible circuit board 30 is not overlapped with a pattern of an orthographic projection of the edge of the second cover film 22 adjacent to the overhung end 211 of the golden finger body 21 onto the display panel flexible circuit board 30. With such a structure, it may avoid the occurrence of a relative large stress caused by otherwise overlapping of the projections of the edges.

The edge of the first covering film 23 adjacent to the overhung end 211 of the golden finger body 21 may be closer to the overhung end 211 of the golden finger body 21 than the edge of the second covering film 22 adjacent to the overhung end 211 of the golden finger body 21, or the edge of the second covering film 22 adjacent to the overhung end 211 of the golden finger body 21 may be further away from the overhung end 211 of the golden finger body 21 than the edge of the first covering film 23 adjacent to the overhung end 211 of the golden finger body 21.

Specific shapes of the edge of the first covering film 23 adjacent to the overhung end 211 of the golden finger body 21 and the edge of the second covering film layer 22 adjacent to the overhung end 211 of the golden finger body 21 may be varied as long as such shapes don't have any holes or grooves with sharp corners. Optionally, the shape of the edge of the first covering film 23 adjacent to the overhung end 211 of the golden finger body 21 is similar to the shape of the edge of the second covering film 22 adjacent to the overhung end 211 of the golden finger body 21, so as to simplify the manufacturing process.

Optionally, the above curved shape is a wavy line. The wavy line shape has a plurality of curved sections, and such curved sections have radian, thereby reducing occurrence of the stress concentration phenomenon in the first covering layer 23 and the second covering layer 22.

In an optional embodiment, the golden finger body 21 further comprises a through hole 3 penetrating through the first covering film 23, the golden finger body 21 and the second cover film 22. Such a through hole 3 is configured such that a metal solder may enter the through hole when performing welding, and the solidified metal solder may further electrically connect the golden finger with the flexible circuit board, so that when a disconnection occurs between the first covering film 23 and the display panel flexible circuit board 30, the current in the display panel flexible circuit board 30 may still be conducted to the backlight flexible circuit board 10 through the metal solder in the through hole 3.

In an optional embodiment, the position of the through hole 3 provided in one of any two adjacent golden finger bodies 21 is different from the position of the through hole 3 provided in the other of the any two adjacent golden finger bodies 21. Such a construction contributes to prevent simultaneous failure of all the through holes 3 otherwise caused due to a regular arrangement of the through holes.

An embodiment of the present disclosure further provides a display device comprising a backlight flexible circuit board 10 and a display panel flexible circuit board 30. The display device further comprises above mentioned backlight golden finger structure. The above-mentioned backlight golden finger structure has a better connection strength, thereby reducing the occurrence of self-breakage phenomenon. Therefore, the display device provided by the present disclosure has a better quality and a better display effect.

Apparently, various changes and modifications to the disclosure may be made by those skilled in the art without departing from the principles and spirit of the disclosure. Thus, if these changes and modifications to the disclosure fall within scopes defined in the claims and their equivalents of the present disclosure, it is also intended to include these changes and modifications in the present disclosure.

What is claimed is:

1. A backlight golden finger structure, comprising:
   a plurality of golden finger bodies, a first end of each of the plurality of golden finger bodies being configured to be connected with a backlight flexible circuit board, and a second end of each of the plurality of golden finger bodies being overhung and configured to be connected with a display panel flexible circuit board at a first surface of each of the plurality of golden finger bodies; and
   a first covering film disposed on the first surface of each of the plurality of golden finger bodies, an edge of the first covering film adjacent to the overhung second end of the golden finger body being in a curved shape,
   wherein a second covering film is provided on a second surface of each golden finger body facing away from the first surface, and an edge of the second covering film adjacent to the overhung end of the golden finger body is in a curved shape,
   wherein a pattern of an orthographic projection of the edge of the first covering film adjacent to the overhung end of the golden finger body onto the display panel flexible circuit board does not intersect a pattern of an orthographic projection of the edge of the second covering film adjacent to the overhung end of the golden finger body onto the display panel flexible circuit board, and
   wherein the edge of the first covering film adjacent to the overhung end of the golden finger body is closer to the overhung end of the golden finger body than the edge of the second covering film adjacent to the overhung end of the golden finger body.

2. The backlight golden finger structure according to claim 1, wherein,
   a shape of the edge of the first covering film adjacent to the overhung second end of the golden finger body is the same as a shape of the edge of the second covering film adjacent to the overhung second end of the golden finger body.

3. The backlight golden finger structure according to claim 2, wherein,
   the golden finger body further comprises a through hole penetrating through the first covering film, the golden finger body and the second covering film.

4. The backlight golden finger structure according to claim 1, wherein the curved shape is a wavy line.

5. The backlight golden finger structure according to claim 4, wherein,
   the golden finger body further comprises a through hole penetrating through the first covering film, the golden finger body and the second covering film.

6. The backlight golden finger structure according to claim 1, wherein,
   the golden finger body further comprises a through hole penetrating through the first covering film, the golden finger body and the second covering film.

7. The backlight golden finger structure according to claim 6, wherein,
   a position of the through hole provided in a first one of any two adjacent golden finger bodies is different from a position of the through hole provided in a second one of the any two adjacent golden finger bodies.

8. A display device, comprising a backlight flexible circuit board and a display panel flexible circuit board, wherein, the display device further comprises the backlight golden finger structure of claim 1.

* * * * *